United States Patent
Lee et al.

(10) Patent No.: US 6,784,068 B2
(45) Date of Patent: Aug. 31, 2004

(54) CAPACITOR FABRICATION METHOD

(75) Inventors: Kee Jeung Lee, Seoul (KR); Hai Won Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/634,550

(22) Filed: Aug. 5, 2003

(65) Prior Publication Data

US 2004/0126963 A1 Jul. 1, 2004

(30) Foreign Application Priority Data

Dec. 26, 2002 (KR) .................................. 10-2002-0084390

(51) Int. Cl.⁷ ............................................. H01L 21/20
(52) U.S. Cl. .................... 438/396; 438/397; 438/253; 438/239; 438/241; 438/254; 438/398; 438/240; 438/702; 438/666
(58) Field of Search ................................. 438/396, 397, 438/240, 702, 666, 398, 253, 239, 241, 254

(56) References Cited

U.S. PATENT DOCUMENTS

| | | | | |
|---|---|---|---|---|
| 5,872,041 A | * | 2/1999 | Lee et al. | 438/397 |
| 5,939,746 A | * | 8/1999 | Koyama et al. | 257/306 |
| 5,940,713 A | * | 8/1999 | Green | 438/396 |
| 5,953,609 A | * | 9/1999 | Koyama et al. | 438/253 |
| 5,970,359 A | * | 10/1999 | Wang | 438/396 |
| 6,197,682 B1 | * | 3/2001 | Drynan et al. | 438/639 |
| 2002/0056868 A1 | * | 5/2002 | Wu | 257/310 |
| 2004/0014278 A1 | * | 1/2004 | Lee et al. | 438/239 |

* cited by examiner

Primary Examiner—Matthew Smith
Assistant Examiner—Victor Yevsikov
(74) Attorney, Agent, or Firm—Ladas & Parry

(57) ABSTRACT

A capacitor is fabricated over a first layer having a first conductive plug formed on a substrate in a semiconductor memory. On the first layer, a silicon nitride film, a first capacitor oxide film, and a second oxide film are sequentially formed. The first and the second oxide films have different wet etch rates. Dry and wet etchings are sequentially performed to the first and second oxide films to form a second contact hole. The second contact hole is then etched. Thereafter, a silicon film and a filler film are sequentially formed on the resultant surface of the structure. A cylindrical storage node electrode is then formed by etching a predetermined portion of the filler film and the silicon film. After removing the remaining filler film and the oxide films, a $Ta_2O_5$ dielectric film covering the storage node electrode and a TiN film for an upper electrode are then sequentially formed.

20 Claims, 5 Drawing Sheets

CAPACITOR FABRICATION METHOD

FIELD OF THE INVENTION

The present application relates generally to a fabrication method of semiconductor memory devices, and more particularly, to a capacitor fabrication method capable of enhancing the capacitance of a capacitor.

BACKGROUND OF THE INVENTION

The sharp increase of the recent demands for memory devices may be due to the advances in semiconductor fabrication technologies. In a semiconductor memory device, capacitors are generally utilized as the data storage means. The capacitance of a capacitor in a semiconductor device is variable based on the distance between two electrodes and the dielectric constant of a dielectric film inserted in between the two electrodes.

However, as the semiconductor memory devices are highly integrated, the high integration tends to decrease the area for the fabrication of the capacitors and thus leads to the reduced capacitor capacitance because of the decreased electrode area in the semiconductor device.

FIGS. 1A–1D are sectional views illustrating a conventional fabrication method of a capacitor in a semiconductor memory device.

As shown in FIG. 1A, bit lines 3 are formed on a semiconductor substrate 1, and the insulation spacers 4 are formed on the lateral portions of the bit lines 3. Although not shown in the drawings, transistors including the dopant regions for the source/drain and for the gate electrodes are also fabricated on the semiconductor substrate 1. The description relating to the transistor fabrication processes, which may occur before the formation of the bit lines, is omitted here.

Thereafter, several films are formed over the semiconductor substrate 1, the bit lines 3, and the insulation spacers 4 in the order of: an interlayer insulation film 5, a silicon nitride film 6, and a buffer film 7 as shown in FIG. 1A. The buffer film 7 is made from an oxide film of Plasma Enhanced-Tetraethyl Orthosilicate (PE-TEOS) at a thickness of 500 to 1500 Å. Then a pattern of photosensitive film 20 is formed on the buffer film 7 to expose contact areas (not shown in FIG. 1A) for etching. The buffer film 7, silicon nitride film 6, and the interlayer insulation film 5 are etched according to the photosensitive film pattern as a mask to form contact holes h1 as shown in FIG. 1B. The photosensitive film pattern 20 is then removed.

A first polysilicon film is formed on a resultant structure including inside the contact holes h1, and then an etch-back or a Chemical Mechanical Polishing (CMP) is performed on the first polysilicon film to form conductive plugs 8 in the contact holes h1.

Then, as shown in FIG. 1C, a capacitor oxide film 9 such as a PE-PEOS or PSG film is formed on the resulting surface of the conductive plugs 8 and the buffer film 7. A second polysilicon film 10 is formed on the oxide film 9 as a hard mask. A photosensitive film pattern (not shown) that defines a capacitor area is then formed on the second polysilicon film 10.

The second polysilicon film 10 and the capacitor oxide film 9 are then etched by using the photosensitive pattern (not shown) as an etching barrier, up to the extent that the conductive plugs 8 are exposed in order to form contact holes h2 for forming storage node electrodes (shown as 11a in FIG. 1D). Then, a third polysilicon film 11 (which is used for forming the storage node electrodes shown as 11a in FIG. 1D) is formed on the surface of the resultant structure as shown in FIG. 1C.

Now referring to FIG. 1D, an etch-back or a CMP is performed on the third polysilicon film 11, which covers the walls of the contact holes h2, so that the storage node electrodes 11a are formed in the shape of cylinders on the conductive plugs 8.

The second polysilicon film 10 (FIG. 1C) used for a hard mask and the oxide film 9 (FIG. 1C) are removed. Then, a $Ta_2O_5$ dielectric film 12 and a TiN upper electrode 13 are sequentially formed on the storage node electrodes 11a. In order to reduce the contact resistance of the memory cell and the surrounding areas, the resultant structure including the capacitor TiN upper electrode 13 is heat treated at the temperature of 800–900° C. (14).

Fabrication of a semiconductor capacitor adopting a fine wiring process of 0.13 μm or less requires that the capacitor height be of at least 15,000 Å in order to enhance the active area of the storage node electrodes.

However, because the conventional fabrication method as described above deposits the oxide film as the buffer film 7 over the silicon nitride film 6, deposits the silicon nitride film 6 as the etch stopper on the interlayer insulation film 5, and then etches the above deposited films 5, 6, and 7 to form the contact holes h1, the conductive plugs 8 extends over the silicon nitride film 6 by a thickness of 500 to 1500 Å. This reduces the area of the storage node electrodes 11a in proportion to their thickness, while increasing the frequency of bridges between adjacent conductive plugs 8, and causes electrical defects.

Also, in the fabrication method of the prior art, the Critical Dimension (CD) at the inner bottom of a cell is not ensured as a desired sufficient value after a mask process for formation of the storage node electrodes. As a result, after formation of the third polysilicon film 11 for storage node electrodes 11a and during formation of the $Ta_2O_5$ dielectric film 12 and the TiN upper electrode 13, step coverage defects may occur, thereby increasing leakage current from the capacitor.

Furthermore, the prior art method described above performs high temperature heat treatment at 800 to 900° C. after formation of the TiN upper electrode 13 of the capacitor so that oxidation occurs in the interface between the TiN upper electrode 13 and the $Ta_2O_5$ dielectric film 12 during the heat treatment and oxygen vacancies are formed in the $Ta_2O_5$ dielectric film 12. This causes the deterioration of the $Ta_2O_5$ dielectric film 12 and degrades the dielectric properties of the $Ta_2O_5$ dielectric film 12, while $Cl^-$ ions remaining in the upper electrode TiN film 13 causes the worsened leakage current of the capacitor.

SUMMARY OF THE INVENTION

Accordingly, an embodiment of the present invention has been made to solve the above-mentioned problems occurring in the prior art, and an object of the present invention is to provide a capacitor fabrication method in which conductive plugs are prevented from being erected over a silicon nitride film to increase the area of storage node electrodes thereby enhancing the capacitance of a capacitor.

Another object of the invention is to provide a capacitor fabrication method which can ensure the CD at the inner bottom of a memory cell to a desired sufficient value during formation of contact holes for storage node electrodes to improve the step coverage of a $Ta_2O_5$ dielectric film and a TiN upper electrode.

Yet another object of the invention is to provide a capacitor fabrication method which can perform low temperature heat treatment to prevent dielectric property degradation of the $Ta_2O_5$ dielectric film while reducing the ratio of $Cl^-$ ions remaining within the upper electrode TiN film thereby preventing leakage current from a capacitor.

In order to accomplish this object, a capacitor fabrication method according to an embodiment of the present invention comprises the following steps. A semiconductor substrate including at least one conductive plug is provided. A silicon nitride film and double capacitor oxide films are formed on the surface of the substrate having at least one conductive plug. The double capacitor oxide films have different wet etch rates. Dry etching and wet etching are sequentially performed to the selected portions of the double capacitor oxide films. Using the silicon nitride film as an etch stopper, at least one contact hole is formed by etching until the conductive plug is exposed. The contact hole is used for forming a storage node electrode. A silicon film for storage node electrode and a filler film in their order on a resultant surface of the substrate having the contact hole. The filler film and the silicon film are then etched in the selected portions to form a storage node electrode until surfaces of the double capacitor oxide films are exposed to form a cylindrical storage node electrode. The remaining filler film and the double capacitor oxide films are sequentially removed. A $Ta_2O_5$ dielectric film covering the storage node electrode and a TiN film for an upper electrode are then sequentially formed.

Preferably, the silicon nitride film is formed using Low Pressure Chemical Vapor Deposition (LP-CVD) or Plasma Enhanced Chemical Vapor Deposition (PECVD) at a thickness of 200 to 1000 Å.

The double capacitor oxide films preferably include a first capacitor oxide film of any one selected from a group including Phospho-Silicate-Glass (PSG), Boro-Phosphor-Silicate Glass (BPSG), Low Pressure Tetra-Ethyl-Ortho-Silicate (LP-TEOS), and a second capacitor oxide film of Plasma Enhanced Tetra-Ethyl-Ortho-Silicate (PE-TEOS). The first capacitor oxide film preferably has the wet etch rate that causes the first capacitor oxide film to be etched faster than the second capacitor oxide film.

Preferably, etch selectivity of the double capacitor oxide films to the silicon nitride film-is maintained in a range of 5 through 20:1.

Preferably, the dry etching of the double capacitor oxide films is performed to an over-etch target for 10 to 100%.

The wet etching of the double capacitor oxide films preferably makes use of any one of an HF solution to which $H_2O_2$ and ultra pure water are added and an $HF/NH_4F$ mixture solution to which $H_2O_2$ and ultra pure water are added, as a wet etch solution.

In the method according to an embodiment of the invention, the step of forming a silicon film for a storage node electrode is comprised of the following sub-steps. A primary deposition of a polycrystalline silicon film is performed on the surface of the substrate including the contact hole for a storage node electrode. The polycrystalline silicon film is doped with dopants at a first thickness, and the first thickness is 30 to 70% of the thickness of the storage node electrode. A secondary deposition of a silicon film which is not doped with amorphous dopants is then performed at a second thickness on the polycrystalline silicon film doped with dopants. The sum of the first thickness and the second thickness is the thickness of the storage node electrode. Heat treatment is then performed to the resultant structure to grow Hemi-Spherical Gains (HSGs) to a radius of 50 to 300 Å.

Preferably, the silicon film for a storage node electrode is formed at the thickness of 200 to 600 Å, and the step of etching the silicon film for a storage node electrode is performed to the over-etch target of 5 to 10%.

Preferably, the fill film makes use of any one of a photosensitive film and Undoped Silicate Glass (USG) film.

Preferably, the method of the invention may further comprise the step of performing thermal doping treatment under an atmosphere of phosphorus gas (1 to 5% $PH_3/N_2$ or $PH_3/He$) after the step of forming a silicon film for a storage node electrode.

It is preferred that the step of thermal doping treatment is performed in a furnace at a temperature of 600 to 700° C. under a pressure of 1 to 100 torr for 30 to 120 minutes.

Preferably, the method of the invention may further comprise the step of performing Rapid Thermal Process (RTP) to the substrate including the silicon film for a storage node electrode at a temperature of 700 to 950° C. for 10 to 100 seconds, prior to the step of thermal doping treatment.

The method according to an embodiment of the invention may preferably further comprise the following steps. After performing the step of forming a $Ta_2O_5$ dielectric film, primary heat treatment of the substrate including the $Ta_2O_5$ dielectric film is performed to remove carbon impurities and oxygen vacancies in the $Ta_2O_5$ dielectric film. After performing the step of forming the Tin film for an upper electrode, a secondary heat treatment is performed in situ the surface of the resultant structure to remove Cl ions from the TiN film for an upper electrode.

Preferably, the method according to an embodiment of the invention may further comprise the step of performing nitrification in a furnace or using plasma at a temperature of 400 to 700° C. under an $NH_3$ atmosphere, prior to forming the $Ta_2O_5$ dielectric film.

Preferably, the primary heat treatment is performed at a temperature of 600 to 800° C. under an atmosphere of $N_2O$ or $O_2$.

Preferably, the method of the invention may further comprise the steps of performing RTP of the substrate under an atmosphere of $O_2$ (10 to 200 sccm) and $N_2$ (1 to 10 slm), before or after the primary heat treatment.

Preferably, the step of forming a TiN film for an upper electrode comprises forming a first TiN film by CVD and forming a TiN film on the first TiN film via sputtering.

These and various other features as well as advantages which characterize the present invention will be apparent from a reading of the following detailed description and a review of the associated drawings.

DETAILED DESCRIPTION

FIGS. 2A through 2F are sectional views illustrating a capacitor fabrication method according to an embodiment of the present invention.

Figure 2A:
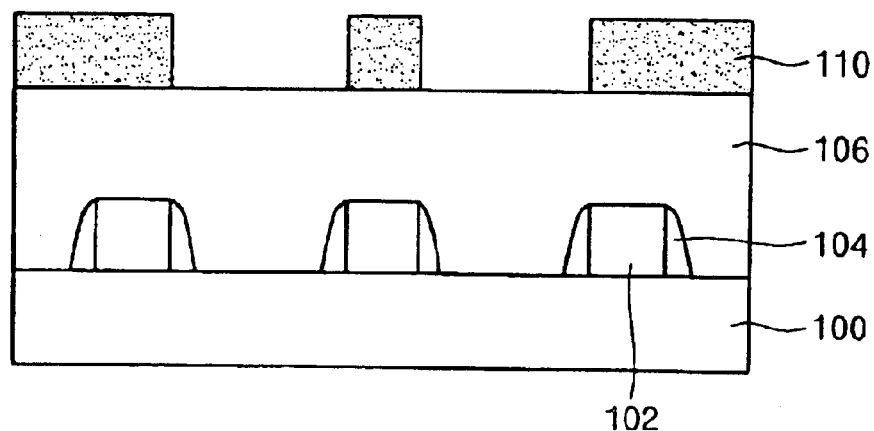
FIGS. 2A to 2F are sectional views illustrating a capacitor fabrication method of the invention.

The capacitor fabrication method according to an embodiment of the present invention, as shown in FIG. 2A, forms bit lines 102 on a semiconductor substrate 100 and thereafter forms insulation spacers 104 on the lateral portions of the bit lines 102. Although it is not shown in the drawings, transistors having source/drain regions and gate electrodes may also be fabricated on the semiconductor substrate 100. The description relating to the transistor fabrication processes that may occur before the formation of the bit lines 102 is omitted.

Thereafter, an interlayer insulation film 106 is formed on a resultant structure as shown in FIG. 2A. A pattern of photosensitive film 110 is then formed on the interlayer insulation film 106 to expose the contact areas (not shown in FIG. 2A).

Figure 2B:
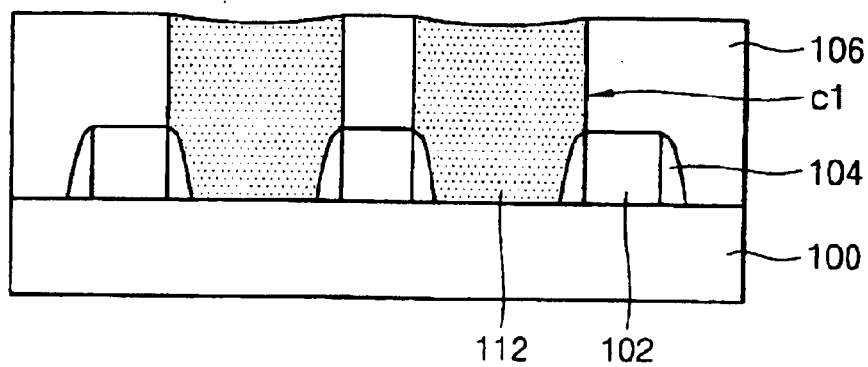

As shown in FIG. 2B, the interlayer insulation film 106 is dry etched to form contact holes c1 by using the photosensitive film pattern 110 as a mask. Then the photosensitive film pattern 110 is removed. In this embodiment, the interlayer insulation film 106 is over dry etched by about 30%. A first polysilicon film is formed on the etched surface of the substrate including inside the contact holes c1. Then an etch-back or a Chemical Mechanical Polishing (CMP) is performed on the first polysilicon film to form conductive plugs 112 inside the contact holes c1.

The first polysilicon film may be formed by the Low Pressure Chemical Vapor Deposition (LPCVD) equipment or the Rapid Thermally Process (RTP) equipment. The first polysilicon film may also be doped with phosphorous to have the phosphorous density of at least 2E20 atoms/cc.

Figure 2C:
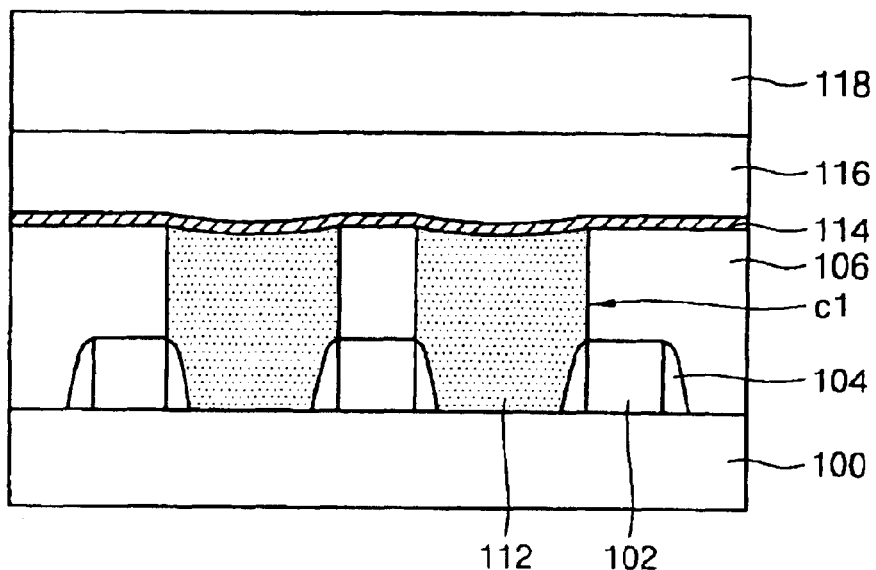

As shown in FIG. 2C, a silicon nitride film 114, a first capacitor oxide film 116, and a second capacitor oxide film 118 are then formed in such order on the surface of the interlayer insulation film 106 and the conductive plugs 112. The silicon nitride film 114 functions as an etch stopper in a following dry or wet etching process of the first and second oxide films 116, 118 The silicon nitride film 114 is formed to a thickness of 200 to 800 Å generally by using an equipment for LPCVD, Plasma Enhanced Chemical Vapor Deposition (PECVD), or RTP.

Figure 2D:
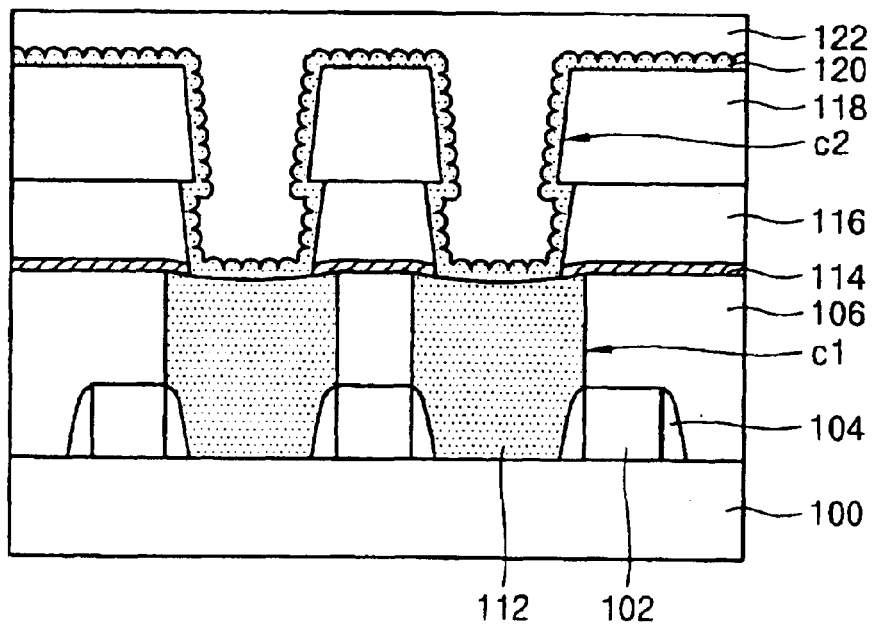

Now referring to FIG. 2D, the wet etch rate of the first capacitor oxide film 116 is different from the wet etch rate of the second capacitor oxide film 118 in order to cause the first capacitor oxide film 116 to be more rapidly etched than the second capacitor oxide film 118 in, for example, the etching solutions of HF and HF/NH4F mixture. For example, the first capacitor oxide film 116 may be made from PSG, BPSG or Low Pressure-Tetraethyl Orthosilicate (LP-TEOS), and the second capacitor oxide film 118 may be made from LP-TEOS.

In sequence, although not shown in the drawings, a second polysilicon film for a hard mask and an anti-reflective film are formed on the second oxide film 118 in their order. The anti-reflective is made of an inorganic material such as SiON or an organic material to a thickness of at least 300 to 1000 Å. The second polysilicon film for the hard mask and the anti-reflective film are not shown in FIGS. 2D and 2E.

Referring again to FIG. 2D, a pattern of photosensitive film (not shown) for defining a capacitor area is formed on the second oxide film 118. Then, dry and wet etching processes are sequentially performed on the second and first capacitor oxide films 116, 118 by using the photosensitive film pattern (not shown) as an etching mask in order to form contact holes c2 as shown in FIG. 2D for forming storage node electrodes (described later with respect to 121 of FIG. 2E). Further as shown in FIG. 2D, the first and second oxide films 116, 118 are etched until the conductive plugs 112 are exposed inside and at the bottom of the contact hole c2. As the first capacitor oxide film 116 is wet etched at a rate faster than that of the second capacitor oxide film 118 inside the contact holes c2, the bottom Critical Dimension (CD) of the contact hole c2 can be obtained to a desired sufficient value, an example shape of the contact holes having the desired sufficient bottom CD is shown in FIG. 2D.

Dry etching of the first and second capacitor oxide films 116, 118 is performed to an over-etching target of 10 to 100%. The wet etching uses a mixture solution, among others, of HF containing $H_2O_2$ and ultra pure water or HF/NH$_4$F containing $H_2O_2$ and ultra pure water.

In order to effectively use the silicon nitride film 114 as the etch stopper, the etch selectivity of the first capacitor oxide film 116 to the silicon nitride film 114 is maintained in a range of 5 through 20 (the etch selectivity of the first capacitor oxide film 116) to 1 (the etch selectivity of the silicon nitride film 114).

Then, the photosensitive film pattern (not shown) is removed.

Thereafter, a silicon film 120 is formed by utilizing the following technique. The silicon film 120 is used for forming storage node electrodes as these features are described in detail later with respect to FIG. 2E, 121. A first polysilicon film doped with dopants is first deposited at 30 to 70% of the desired thickness of the silicon film 120 on the surface of the substrate including the contact holes c2. Then a silicon film without amorphous dopants is secondly deposited on the first polysilicon film to obtain the final thickness of the silicon film 120. A resultant structure is heat treated to grow Hemi-Spherical Grains (HSG), thereby forming a silicon film 120.

Then, on the surface of the structure including the silicon film 120, a photosensitive film 122 is coated at a thickness of 0.5 to 1.5 μm including inside the contact holes c2 to separate storage node electrodes among memory cells.

Alternatively, the photosensitive film 122 can be made from an Undoped Silicate Glass (USG) oxide film, which may be formed at a thickness of 1.0 to 0.5 μm.

Although not shown in the drawings, right after formation of the silicon film 120 for storage node electrodes, thermal doping is performed in a phosphorus gas atmosphere (1 to 5% $PH_3/N_2$ or $PH_3$ at a flow rate of 50 to 2000 sccm in He at a flow rate of 50 to 2000 sccm). Thermal doping may be performed before deposition of the dielectric film. The above process of thermal doping is performed in a furnace at a temperature of 600 to 700° C. and under a pressure of 1 to 100 torr for 30 to 120 minutes.

In the meantime, RTP is performed at a temperature of 700 to 950° C. for 10 to 100 seconds before the thermal doping process in order to drop the contact resistance in the cell and surrounding areas.

Figure 2E:
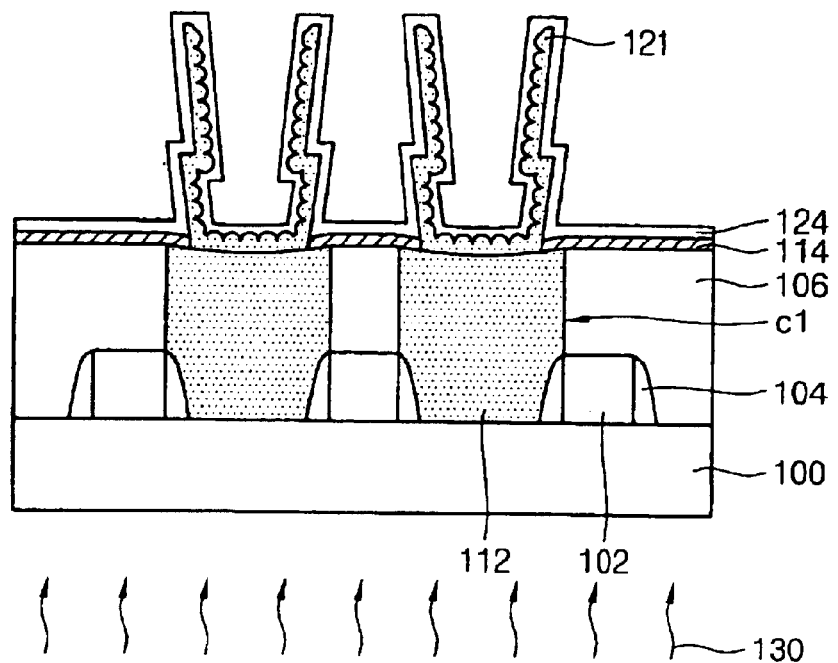

Then, now referring to FIG. 2E, both the photosensitive film 122 and the silicon film 120 for storage node electrodes are sequentially etched to form the storage node electrodes 121, each of which is in the cylindrical form and covers the walls of the contact holes c2 as shown in FIG. 2E. The silicon film 120 is utilized to form storage node electrodes 121.

Referring back to FIG. 2D, during the etching process of the photosensitive film 122 and the silicon film 120 to form the storage node electrodes 121, the silicon film 120 for storage node electrodes is over-etched by 5 to 10%. When the silicon film 120 for storage node electrodes is over-etched by about 10%, the second capacitor oxide film 118 is excessively etched to reduce the area of the storage node electrodes thereby reducing the capacitance of an overall capacitor.

In the meantime, the storage node electrodes 121 are susceptible to being separated among the memory cells through etching, and the HSGs may be crumbled which may cause the crumbled pieces to be poorly removed in a later cleaning process. In order to prevent such a potential problem, the photosensitive film 122 (Pig. 2D) is developed through exposure to an energy source of 1000 to 5000 mJ before the etching is performed.

Then, remaining portions of the photosensitive film 122, the first capacitor oxide film 116 and the second capacitor oxide film 118 are removed. The first and second capacitor oxide films 116, 118 are removed via wet etching.

Referring to FIG. 2E, after a $Ta_2O_5$ dielectric film 124 is formed at a thickness of 50 to 100 Å on the storage node electrodes 121, first heat treatment 130 is performed to an entire resultant structure including the $Ta_2O_5$ dielectric film 124 at a temperature of 600 to 800° C. in an $N_2O$ or $O_2$ atmosphere in order to remove the carbon impurities and the oxygen vacancies in the $Ta_2O_5$ dielectric film 124.

Before the formation of the $Ta_2O_5$ dielectric film 124, the resultant structure including the storage node electrodes 121 is nitrated with plasma or a furnace in an $NH_3$ atmosphere. Nitridation is performed at a temperature of 400 to 700° C. In order to maximize the activation of dopants existing in the storage node electrodes 121, an RTP is performed by feeding $O_2$ gas at a flow rate of 10 to 200 sccm and $N_2$ gas at a flow rate of 1 to 10 slm before or after first heat treatment 130.

Figure 2F:
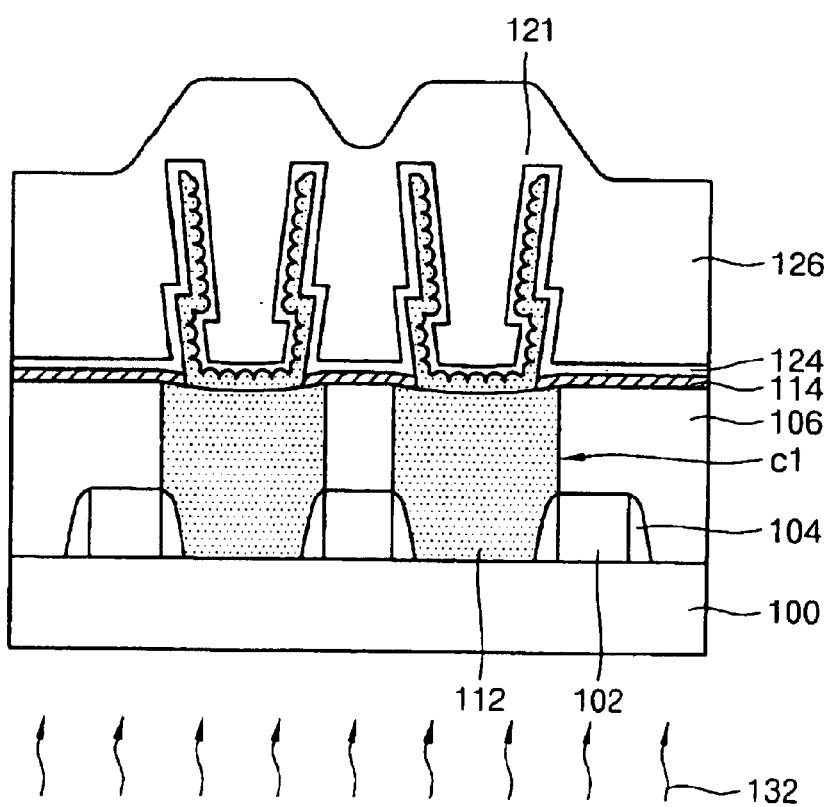

Then, as shown in FIG. 2F, a TiN upper electrode 126 is formed at a thickness of 100 to 500 Å on the $Ta_2O_5$ dielectric film 124 which has underwent first heat treatment by using a $TiCl_4$-source as a precursor, and a second heat treatment 132 is performed by using $NH_3$ gas in situ to remove Cl ions within the TiN upper electrode 126.

In this case, the TiN upper electrode 126 is formed of a CVD-TiN film at a thickness of 100 to 500 Å. However, because the CVD-TiN film is poor in step coverage, the TiN upper electrode 126 may locally fail to form on a memory cell, which may contribute to the increased leakage current. In order to overcome this problem, the TiN upper electrode 126 may be alternatively formed by depositing primarily a CVD-TiN film and then a PVD-TiN film thereon via sputtering.

Also, a polysilicon film (not shown) doped with dopants may be formed at a thickness of 100 to 1000 Å on the TiN upper electrode 126. The polysilicon film functions as a protective film against stress and thermal impact, which may occur in the second heat treatment 132.

Figure 1A:
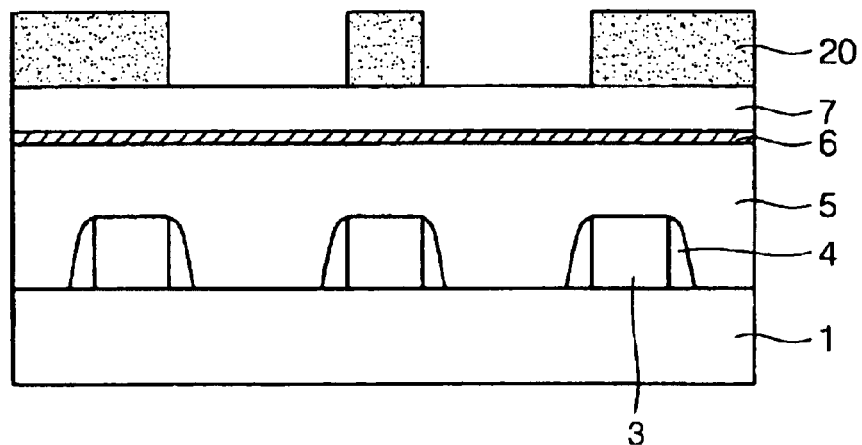
FIGS. 1A to 1D are sectional views illustrating a capacitor fabrication method of the prior art.
Figure 1B:
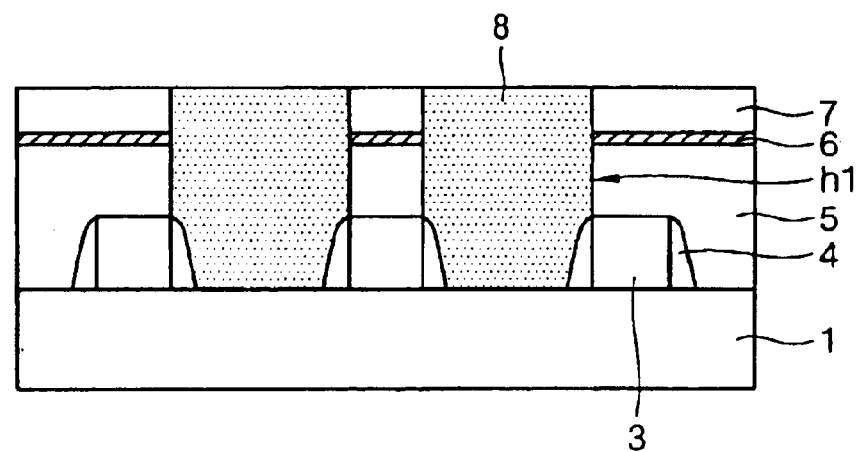
Figure 1C:
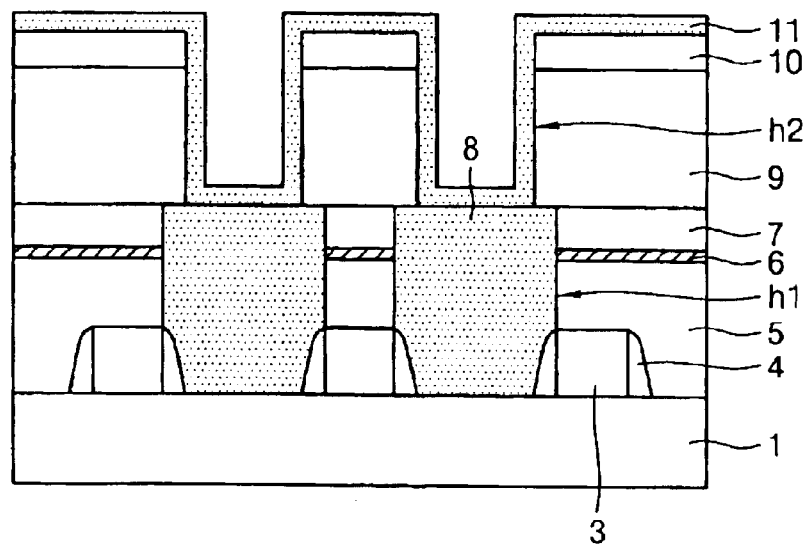
Figure 1D:
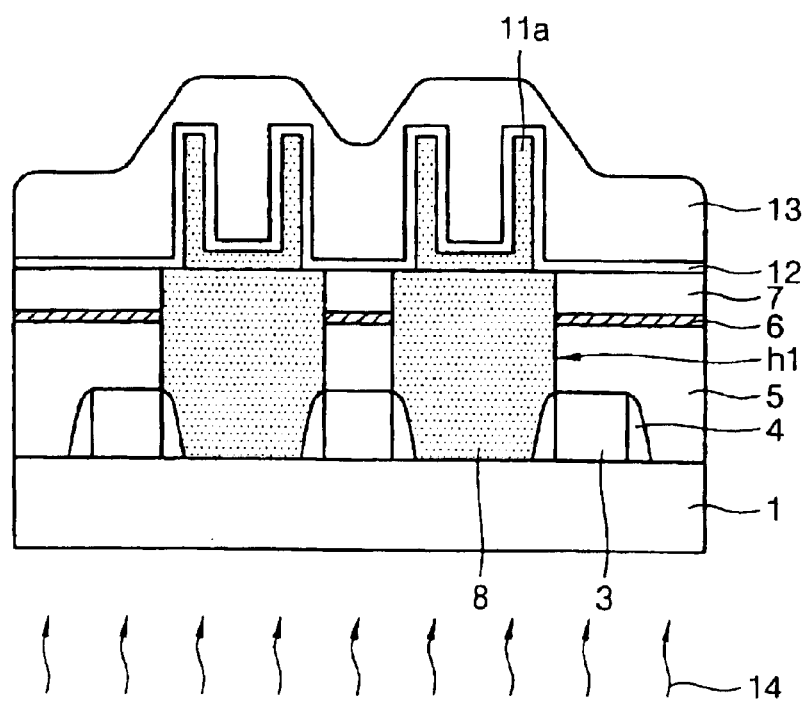

According to an embodiment of the present invention as set forth above, the conductive plugs in the contact holes (such as c2) are formed after formation of the contact holes (such as c1) in the interlayer insulation film (such as 106). This eliminates the formation of the silicon nitride film (such as 6 of FIG. 1B, Prior Art) and the oxide film as a buffer (such as 7 of FIG. 1B, Prior Art), and, as a result, the number of the fabrication processes, according to an embodiment of the present invention,is reduced. This saves the fabrication cost. The fabrication technique as disclosed above according to an embodiment of the invention also prevents the decrease in the storage node electrode area, as this may occur in a prior art method due to the conductive plugs (such as 8 of FIG. 1D, Prior Art) being erected over (or having a thickness that extends over the layer of) the silicon nitride film (such as 6 of FIG. 1D, Prior Art).

Further, an embodiment of the present invention employs the double structure of the first and second capacitor oxide films (such as 116, 118 of FIG. 2D), each having a different wet etch rate, in forming the contact holes (such as c2 of FIG. 2D) for storage node electrodes to ensure that the desired CD is obtained at the inner bottom of the cell or the contact hole c2. Further, the leakage current of the capacitor is reduced resulting from the improvement of the step coverage in deposition of the $Ta_2O_5$ dielectric film (such as 12 of FIG. 1D, Prior Art) and the TiN upper electrode (such as 13 of FIG. 1D, Prior Art) thereby improving the refreshment characteristics of a memory cell.

An embodiment of the present invention also performs thermal doping in the phosphorous gas atmosphere (wherein 1 to 5% $PH_3/N_2$ or $PH_3/He$ at a flow rate of 50 to 2000 sccm is fed) at 600 to 700° C. after the formation of the silicon film (such as 120 of FIG. 2D) for storage node electrodes, in order to overcome the degradation problem of the $Ta_2O_5$ dielectric film of the prior art which will degrade in the high temperature heat treatment processes. The thermal doping also prevents the impurity based damages of the storage node electrode, thereby minimizing depletion and enhancing capacitance.

Furthermore, the heat treatment is performed by using $NH_3$ gas in situ after the deposition of the TiN upper electrode to reduce current leakage from the $Ta_2O_5$ dielectric film thereby enhancing capacitance.

It will be clear that the present invention is well adapted to attain the ends and advantages mentioned as well as those inherent therein. While a presently preferred embodiment has been described for purposes of this disclosure, various changes and modifications may be made which are well within the scope of the present invention. Numerous other changes may be made which will readily suggest themselves to those skilled in the art and which are encompassed in the spirit of the invention disclosed and as defined in the appended claims.

What is claimed is:

1. A method of fabricating a capacitor over a first layer having a first conductive plug formed on a substrate in a semiconductor memory, the capacitor fabrication method comprising the steps of:

forming a silicon nitride film on the first layer;

forming a first capacitor oxide film on the silicon nitride film;

forming a second capacitor oxide film over the first capacitor oxide film, wherein the wet etch rate of the first capacitor oxide film is different from the etch rate of the second capacitor oxide film;

performing etching to a selected portion of the first and capacitor oxide films using the silicon nitride film as an etch stopper to form at least one contact hole for a storage node electrode, wherein the second contact hole is etched until the first conductive plug of the first layer is exposed;

sequentially forming a silicon film for storage node electrode and a filler film on the resultant surface of the first and second capacitor oxides including the surface of the contact hole;

forming a cylindrical storage node electrode by etching a predetermined portion of the filler film and the silicon film until the surfaces of the first and second capacitor oxide films are exposed to form a cylindrical storage node electrode;

sequentially removing the remaining filler film and first and second oxide films; and sequentially forming a $Ta_2O_5$ dielectric film covering the storage node electrode and a TiN film for an upper electrode.

2. The method as set forth in claim 1, wherein the silicon nitride film is formed at a thickness of 200 to 1000 Å by using Low Pressure Chemical Vapor Deposition (LP-CVD) or Plasma Enhanced Chemical Vapor Deposition (PECVD).

3. The method as set forth in claim 1, wherein the etching of the first and second capacitor oxide film is sequentially performed dry etching and wet etching.

4. The method as set forth in claim 3, wherein the wet etching of the first and second capacitor oxide films makes use of any one of an HF solution to which $H_2O_2$ and ultra pure water are added and an HF/NH4F mixture solution to which $H_2O_2$ and ultra pure water are added, as a wet etch solution.

5. The method as set forth in claim 1, wherein the first capacitor oxide film is any one of a Phospho-Silicate-Glass (PSG), Boro-Phosphor-Silicate Glass (BPSG), Low Pressure Tetra-Ethyl-Ortho-Silicate (LP-TEOS), and a second capacitor oxide film is made of Plasma Enhanced Tetra-Ethyl-Ortho-Silicate (PE-TEOS).

6. The method as set forth in claim 5, wherein the first capacitor oxide film has a wet etch rate that causes the first capacitor oxide film to be etched faster than the second capacitor oxide film.

7. The method as set forth in claim 1, wherein the dry etching of the first and second capacitor oxide films is performed to an over-etch target for 10 to 100%.

8. The method as set forth in claim 1, wherein etch selectivity of the first and second capacitor oxide films to the silicon nitride film is maintained in a range of 5:1 to 20:1.

9. The method as set forth in claim 1, wherein the silicon film for a storage node electrode is formed at thickness of 200 to 600 Å.

10. The method as set forth in claim 1 or 9, wherein the step of forming the silicon film for the storage node electrode comprises the steps of:
    depositing a polycrystalline silicon film doped with dopants to a first thickness on the resulting surface of the second capacitor oxide film including the surface inside the contact hole for forming a storage node electrode, wherein the first thickness is from 30 to 70% of the thickness of the storage node electrode;
    depositing a silicon film, which is not doped with amorphous dopants, to a second thickness on the polycrystalline silicon film doped with dopants, wherein sum of the first thickness and the second thickness is the thickness of the storage node electrode; and
    performing heat treatment to the resultant structure to grow Hemi-Spherical Gains (HSGs) to a radius of 50 to 300 Å.

11. The method as set forth in claim 1, wherein the step of etching the silicon film for a storage node electrode is performed to the over-etch target for 5 to 10%.

12. The method as set forth in claim 1, wherein the filler film is any one of a photosensitive film and Undoped Silicate Glass (USG) film.

13. The method as set forth in claim 1, further comprising a step of performing thermal doping treatment under an atmosphere of phosphorus containing gas after the step of forming the silicon film for the storage node electrode.

14. The method as set forth in claim 13, wherein the step of thermal doping treatment is performed in a furnace at a temperature of 600 to 700° C. under a pressure of 1 to 100 torr for 30 to 120 minutes.

15. The method as set forth in claim 13, further comprising a step of performing Rapid Thermal Process (RTP) to the substrate including the silicon film for a storage node electrode at a temperature of 700 to 950° C. for 10 to 100 seconds, prior to the step of thermal doping treatment.

16. The method as set forth in claim 1, further comprising the steps of:
    performing primary heat treatment after forming the $Ta_2O_5$ dielectric film to remove carbon impurities and oxygen vacancies in the $Ta_2O_5$ dielectric film; and
    performing secondary heat treatment in situ after forming the TiN film for the upper electrode on the surface of the resulting structure to remove Cl ions from the TiN film.

17. The method as set forth in claim 16, wherein the primary heat treatment is performed at the temperature of 600 to 800° C. under the atmosphere of $N_2O$ or $O_2$.

18. The method as set forth in claim 16, further comprising: before or after performing the primary heat treatment, performing RTP under an atmosphere of $O_2$ and $N_2$.

19. The method as set forth in claim 1, further comprising: prior to forming the $Ta_2O_5$ dielectric film, performing nitrification in a furnace or using plasma at a temperature of 400 to 700° C. under an $NH_3$ atmosphere.

20. The method as set forth in claim 1, wherein the step of forming a TiN film for an upper electrode comprises the steps of:
    forming a first TiN film by CVD; and
    forming a second TiN film on the first TiN film via sputtering.

* * * * *